United States Patent
Rutter et al.

(10) Patent No.: US 9,171,837 B2
(45) Date of Patent: Oct. 27, 2015

(54) CASCODE CIRCUIT

(71) Applicant: NXP B.V., Eindhoven (NL)

(72) Inventors: Philip Rutter, Stockport (GB); Jan Sonsky, Leuven (BE); Matthias Rose, Helmond (NL)

(73) Assignee: NXP B.V., Eindhoven (NL)

( * ) Notice: Subject to any disclaimer, the term of this patent is extended or adjusted under 35 U.S.C. 154(b) by 23 days.

(21) Appl. No.: 14/094,890

(22) Filed: Dec. 3, 2013

(65) Prior Publication Data
US 2014/0167822 A1 Jun. 19, 2014

(30) Foreign Application Priority Data
Dec. 17, 2012 (EP) .................................. 12197535

(51) Int. Cl.
| | | |
|---|---|---|
| H03K 3/00 | (2006.01) | |
| H01L 27/06 | (2006.01) | |
| H01L 23/495 | (2006.01) | |
| H03K 17/567 | (2006.01) | |
| H01L 23/482 | (2006.01) | |
| H01L 25/07 | (2006.01) | |

(52) U.S. Cl.
CPC ........ *H01L 27/0629* (2013.01); *H01L 23/4824* (2013.01); *H01L 23/49531* (2013.01); *H01L 23/49562* (2013.01); *H01L 23/49575* (2013.01); *H03K 17/567* (2013.01); *H01L 25/072* (2013.01); *H01L 2224/48247* (2013.01); *H01L 2224/48257* (2013.01); *H01L 2224/49171* (2013.01); *H01L 2924/12032* (2013.01); *H01L 2924/13055* (2013.01); *H01L 2924/13091* (2013.01); *H01L 2924/30107* (2013.01)

(58) Field of Classification Search
None
See application file for complete search history.

(56) References Cited

U.S. PATENT DOCUMENTS

| | | | | |
|---|---|---|---|---|
| 7,504,733 | B2* | 3/2009 | Lopez | 257/778 |
| 8,674,497 | B2* | 3/2014 | Cho et al. | 257/691 |
| 8,963,338 | B2* | 2/2015 | Lin et al. | 257/777 |
| 8,987,883 | B2* | 3/2015 | Cho et al. | 257/676 |
| 2004/0251525 | A1* | 12/2004 | Zilber et al. | 257/678 |
| 2005/0161785 | A1 | 7/2005 | Kawashima et al. | |
| 2005/0189561 | A1 | 9/2005 | Kinzer et al. | |
| 2006/0237825 | A1* | 10/2006 | Pavier et al. | 257/666 |
| 2007/0063216 | A1 | 3/2007 | Hu et al. | |
| 2009/0261461 | A1* | 10/2009 | Sapp et al. | 257/666 |
| 2010/0201439 | A1 | 8/2010 | Wu et al. | |
| 2011/0095411 | A1* | 4/2011 | Herbsommer et al. | 257/676 |
| 2012/0168922 | A1* | 7/2012 | Cho et al. | 257/676 |
| 2012/0181674 | A1* | 7/2012 | Cho et al. | 257/666 |
| 2012/0223321 | A1 | 9/2012 | Lin et al. | |
| 2013/0082912 | A1* | 4/2013 | Smith | 345/82 |
| 2014/0203419 | A1* | 7/2014 | Cho et al. | 257/666 |
| 2015/0041967 | A1* | 2/2015 | Wachter et al. | 257/676 |

OTHER PUBLICATIONS

Extended European Search Report for EP Patent Appln. No. 12197535.3 (May 23, 2013).

* cited by examiner

*Primary Examiner* — Lincoln Donovan
*Assistant Examiner* — Khareem E Almo

(57) ABSTRACT

A cascode circuit arrangement has a low voltage MOSFET and a depletion mode power device mounted on a substrate (for example a ceramic substrate), which can then be placed in a semiconductor package. This enables inductances to be reduced, and can enable a three terminal packages to be used if desired.

17 Claims, 4 Drawing Sheets

CASCODE CIRCUIT

CROSS-REFERENCE TO RELATED APPLICATIONS

This application claims priority under 35U.S.C §119 of European patent application No. 12197535.3, filed on Dec. 17, 2012, the contents of which are incorporated by reference herein.

This invention relates to cascoded semiconductor devices. It relates in particular to depletion mode transistors, such as high electron mobility transistors or junction gate field effect transistors. Examples are gallium nitride (GaN) transistors (e.g. GaN high electron mobility transistors (HEMTs)), or silicon carbide (SiC) field effect transistors.

The invention is of particular interest for GaN power transistors. Basic GaN power semiconductors are depletion mode (normally-on) devices, by virtue of the presence of an in-built hetereojunction created during the growth of the GaN wafer. This creates a thin highly conductive region inside the material, called a two dimensional electron gas ("2DEG"), which effectively defines the transistor channel.

To make a normally-off GaN device, something is required to interfere with the 2DEG to prevent it conducting. Attempts to introduce additional layers in the layer stack of the power semiconductor to make the device normally-off (and thereby interchangeable with MOSFETs) come together with device performance penalties, such as a worse on-resistance than a normally-on device.

Therefore, cascoding high-voltage GaN switches with conventional low-voltage silicon MOSFETs is a viable option to combine the advantages of silicon and GaN power devices.

An advantage of a cascoded switch is that existing standard gate drivers can then be used, as the device drive characteristics are mainly defined by the silicon MOSFET. Therefore the device can be used as a direct replacement for silicon MOSFETs or IGBTs.

FIG. 1 shows a well-known approach of a series connection of a normally-on gallium nitride transistor ($M_{GaN}$) and a normally-off silicon MOSFET transistor ($M_{Si}$) power switch in a cascode configuration. This approach is becoming more and more popular for power electronic applications as new GaN and SiC power semiconductors with superior device characteristics compared to Silicon based switches are emerging.

In the standard cascode configuration of FIG. 1, only the silicon MOSFET $M_{Si}$ is controlled actively by a gate driver, which generates the gate signal $V_{GM}$. The GaN switch $M_{GaN}$ is controlled indirectly via the silicon MOSFET $M_{Si}$ as the MOSFET drain-to-source voltage equals the GaN source-to-gate voltage.

In a cascode circuit such as shown in FIG. 1, the interconnects between the components will serve to slow down switching speed, whereas a high switching speed is one of the desired advantages of GaN. This will contribute to voltage overshoots that may impact the voltage rating (and hence cost) of the low voltage MOSFET.

There is therefore a requirement to create a construction that minimises the inductances (and parasitic resistances) of a cascode arrangement. To minimise voltage overshoots and oscillations and to protect the gate of the GaN device, it is also advantageous to be able to incorporate additional components into the cascode circuit. For example, one proposed use of GaN transistors is in power factor correction (PFC) circuits. For a PFC application, an initial target market for GaN, the PFC diode can also be made in GaN. Methods to integrate the PFC diode are also potentially advantageous.

The inductances of a cascode arrangement are shown in FIG. 2. There are series source, drain and gate inductances $L_S$, $L_D$ and $L_G$ and internal inductances Lint1, Lint2 and Lint3. Lint1 is between the GaN source and the MOSFET drain, Lint2 is between the package source and the GaN gate, and Lint3 is between the package source and the MOSFET source.

When switching the low voltage MOSFET, the inductances of $L_S$ and Lint3 are critical as these inductances serve to reduce the gate drive voltage as the current rapidly increases at turn on, such that the resultant rate of change of current di/dt is governed by the formula below:

$$\frac{di}{dt} = \frac{(Vdrive - Vgs) * gfs}{Cgs * (Rdriver + Rgate) + (Ls + Lint3) * gfs}$$

Cgs, gfs and Rgate refer to the parameters of the LVMOS.

At turn off of the current, the opposite occurs and these inductances increase the gate voltage hence limit the rate at which current can be reduced in the device.

To achieve fast switching (in the di/dt period) it is essential to minimise $L_S$ and Lint3. However, if $L_S$ and Lint3 are too low compared to the total inductance in the application then the high di/dt enabled by the low source inductance in the cascode circuit can result in significant voltage overshoots.

In a cascode arrangement there is an additional factor that can affect the di/dt during switching, and that is the effect of Lint1 and Lint3 on whether the GaN device turns on/off.

For example, when the cascode device is turning on and the current is rapidly rising, a positive voltage (equal to L*di/dt) will appear across $L_S$, Lint1, and Lint3. On the low voltage MOS, $L_S$ and Lint3 will reduce the low voltage MOS gate drive and ultimately limit the maximum di/dt achievable. For the GaN device, the voltage on Lint1 and Lint3 will act like a negative voltage on the gate source voltage of the GaN device and start to turn it off, thereby limiting di/dt and increasing power loss.

Hence in a cascode device the level of internal inductances in the cascode arrangement are also critical.

The effect of Lint3 on limiting di/dt can, in the above diagram, be removed by connecting Lint2 directly to the source metal of the low voltage MOSFET rather than to L. The inductance $L_S$ incorporates the inductances of the bonding pad, internal package interconnect and package pin(s). In this case, minimising Lint1 becomes of critical importance.

A further issue with the basic cascode circuit described above (i.e. without additional components) is that it is designed as a three terminal circuit to connect to source, drain and gate terminals within an external circuit. However, packing the circuit into a three pin package, such as a TO220 package, is not normally possible. The silicon MOSFET is a vertical device, so that the drain (at the bottom of the vertical structure) connects to the metal lead frame and therefore is connected to one of the TO220 pins. Since the MOSFET drain is not one of the output terminals of the cascode circuit, this means a package with 4 or more pins is needed.

FIG. 3 shows how the cascode circuit is conventionally mounted in a 5 pin package (since 4 pin packages are not common).

The MOSFET 10 is a vertical device with the drain at the bottom and the source (and gate) at the top. The MOSFET 10 is mounted on the package die attach area conductor plane so that the drain connects to this plane. This conductor plane connects to one 12 of the terminals. The GaN transistor 14 has its substrate connected to the conductor plane, and the three terminals are at the top. Thus, the substrate of the GaN transistor 14 and the drain of the low voltage MOSFET 10 are electrically connected.

In the case of the cascode circuit described above, this means the die attach area and its associated terminal is now connected to an internal node which is why a four/five pin variant is needed. The MOSFET gate and source connect with wirebonds 16,18 to respective terminals and the GaN drain connects to a third terminal by wirebond 20. An internal wirebond connection 22 connects the MOSFET source to the GaN gate, and the further wirebonds 24 connect from the GaN source to the die attach conductor plane.

In addition to needing more pins than the number of external connections to the circuit, the performance in this package is limited by internal inductances. That performance could also be improved if additional components could be added around the device, with the inductance of internal connections minimised.

According to the invention, there is provided a circuit as claimed in the claims.

In one aspect, the invention provides a cascode transistor circuit comprising:

a first, depletion mode transistor having its drain for connection to a high power line;

a second, silicon MOSFET with its drain connected to the source of the first transistor and its source for connection to a low power line;

a substrate on which the first and second transistors are mounted, which has a conductive track providing the connection between the source of the first transistor and the drain of the second transistor.

The invention provides a cascode circuit on a separate substrate, which then allows for the internal inductances to be minimised. It also allows for the possibility of adding additional components that can improve the cost/performance of the final product.

The circuit is preferably formed as a packaged device, with a first connection from the first transistor drain to a first package terminal, a second connection from the second transistor gate to a second package terminal and a third connection from the second transistor source to a third package terminal, wherein one of the package terminals comprises a die attach pad terminal. For example, the second transistor source can connect to the die attach pad terminal.

This enables the circuit to be provided in a three terminal package, since the die attach pad (i.e. the leadframe/wireframe terminal connection of the package) can be used for one of the external circuit connections. For example, the substrate assembly can be placed in a 3-terminal TO220 package with the main leadframe (the tab of the device on which heatsinks are connected) connected to source rather than drain. Connecting the tab to source reduces EMI which important for fast switching devices like GaN, and also reduces the cost of heatsinking because electrical isolation to the heatsink is no longer needed. The same heatsink can be connected to many devices.

This enables the second transistor to be a vertical device with the drain at the bottom. The substrate can comprise a ceramic substrate.

The first transistor can comprise solder bumps and is flip bonded onto the substrate. The second transistor can comprise connection clips which connect onto the substrate. In this way, the connection of each transistor to the substrate can be optimised independently.

The circuit can comprise further components mounted on the substrate. These further components can comprise:

a capacitor, RC snubber circuit or diode for limiting the maximum voltage at the drain of the first transistor point; or a diode for power factor correction.

The first, depletion mode, transistor can comprise a high electron mobility transistor or a junction gate field effect transistor, for example a GaN transistor.

The invention also provides a circuit arrangement comprising:

a cascode transistor circuit of the invention; and a gate driver circuit having a single gate output line.

The device can comprise:

a power supply; or a power factor correction circuit; or an inverter circuit; or a switched mode power converter circuit.

An example of the invention will now be described in detail with reference to the accompanying drawings, in which.

The invention provides a cascode circuit arrangement in which the low voltage MOSFET and depetion mode power device are mounted on a substrate (for example a ceramic substrate), which can then be placed in a semiconductor package (or sold separately to customers wishing to create their own modules). Reference will be made only to GaN devices below, but the same approach applies to SiC devices or other depletion mode devices. The invention is of interest for high electron mobility transistors or junction gate field effect transistors.

Figure 1:
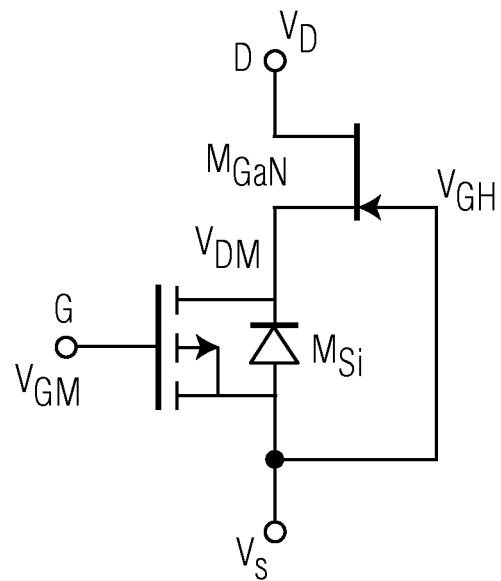
FIG. 1 shows a known cascode circuit.
Figure 2:
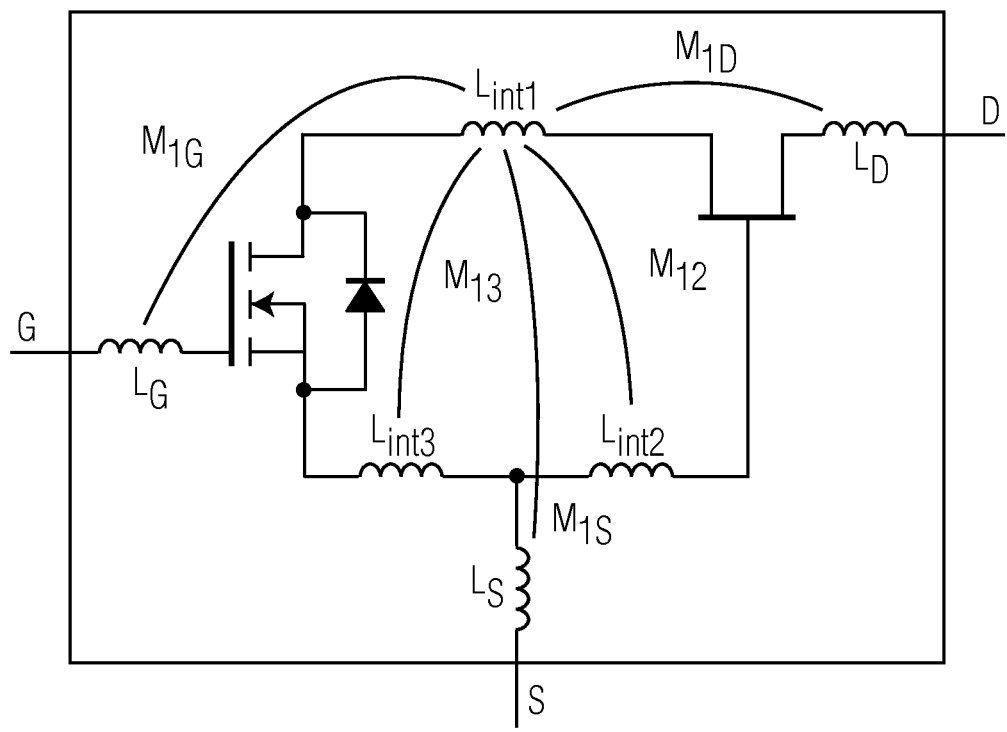
FIG. 2 shows the inductances associated with the circuit of FIG. 1.
Figure 3:
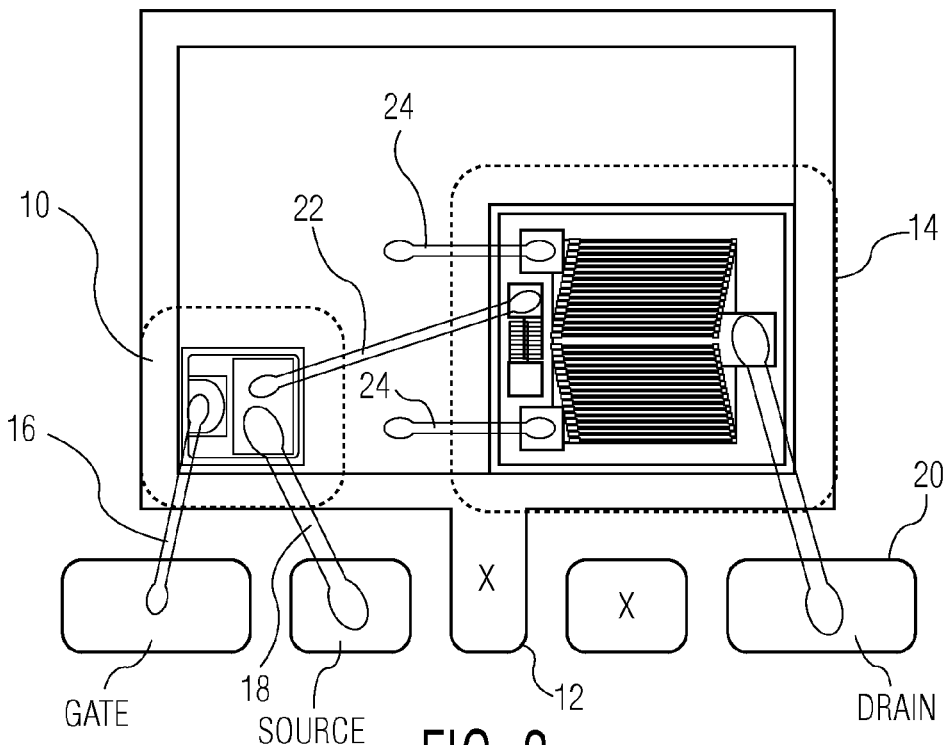
FIG. 3 shows one way to package the circuit of FIG. 1.
Figure 4:
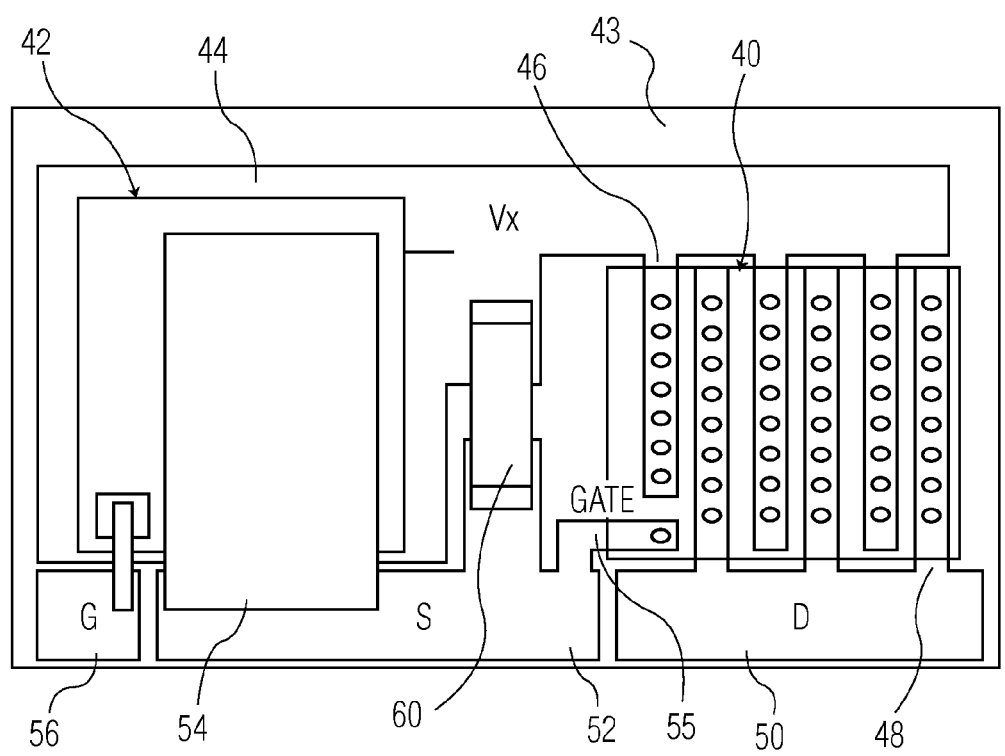
FIG. 4 shows a first example of cascode circuit of the invention.

FIG. 4 shows an example of circuit of the invention. The layout of components is shown, but the electrical circuit corresponds to FIG. 1 (although an optional addition component is shown in FIG. 4 as discussed below).

The circuit has a first, gallium nitride or silicon carbide field effect transistor 40 having a drain D for connection to a high power line. A second, silicon MOSFET 42 has its drain connected to the source of the first transistor 40 and its source S is for connection to a low power line.

The two transistors are mounted on a substrate 43, which can for example comprise a ceramic substrate.

The second transistor 42 is a vertical device with its drain at the bottom. This connects to a pad 44 which provides a conductive track providing a connection between the source of the first transistor 40 and the drain of the second transistor 42. It is at an internal node voltage shown as Vx. The pad includes source fingers 46 for the first transistor 40. Formed in the same layer are the drain fingers 48 which connect to a drain pad 50 which is a first external circuit terminal for connection to a high voltage line.

The source of the second transistor 42, which is at the top of the vertical structure, connects down to a source pad 52 which is a second external circuit terminal for connection to a low voltage line. A clip 54 is shown for this purpose. The source pad 52 also connects to the gate of the first transistor 40 by the track 55.

A gate pad 56 for the second transistor provides a third external terminal.

In a preferred example, the GaN first transistor 40 is bumped and flipped onto the ceramic substrate 43 to minimise parasitic inductances and resistances. However, wirebonding can also be used.

The low voltage silicon MOSFET second transistor 42 is preferably connected with a copper clip 54 to the ceramic substrate, but this could also be a flipped or wirebonded lateral device or it may already be packaged in a low inductance package e.g. Direct FET. This is a suitable option if clip bonding is not available in the required package.

The substrate of the GaN first transistor (which faces upwardly) can be connected to source, drain, or floating depending on what will give the optimal performance. Typically, if the device is flip bonded as shown, the most practical option is to leave the substrate floating.

The preferred arrangement of using a copper clip 54 for the low voltage MOS transistor 42 and flip bonded bumped GaN transistor 40 significantly reduces parasitic inductances.

The tracks 44 on the ceramic substrate 43 can be arranged to be optimised for low inductance and resistance (by using wide tracks, and selecting routing to minimise mutual inductance of power tracks). The example of FIG. 4 is one simple example to demonstrate the basic idea.

The use of the additional substrate 43 enables additional components to be added to the circuit.

For example, in a Cascode device it is desirable to limit the maximum voltage at the internal node (Vx), to minimise gate-source voltage stress on the GaN device and to enable use of a silicon MOSFET with lowest possible $V_{DS}$ rating. The use of a MOSFET in the high voltage circuit means that the MOSFET can be exposed to various possible current and voltage conditions which can lead to early failure. Limiting the voltage Vx acts as a protection mechanism.

FIG. 4 shows an additional capacitor 60 connected between the source terminal and the internal node Vx. This also could be an RC snubber, a zener diode (to clamp the maximum Vx voltage), or a Schottky diode to minimise reverse recovery losses in the low voltage MOSFET 42.

This idea can easily be extended to include a PFC diode to produce an integrated PFC product where the PFC can either be a separate die or integrated into the GaN die. Note this would require a 4 pin package. Further integration could include the control IC for the PFC circuit.

A common package for high voltage MOSFETS (~600V) is the so-called TO220 package, which is a three terminal package, with one terminal connecting to the wireframe/leadframe pad which function as the die attach pad. This is also electrically connected to a heatsink connection. This type of through hole package is preferred due to the relatively low technology PCB materials and manufacturing techniques.

A disadvantage of the package when making use of vertical power devices, where the substrate is the drain, is that the exposed tab of the package is at drain potential. If the power devices require heatsinking, providing the required electrical isolation increases the complexity (and therefore cost) of the overall solution.

For fast switching transients, exposed tabs at drain potential are also a source of unwanted EMI. This issue becomes more significant in a cascode device due to the inherently faster switching transients compared to existing high voltage MOSFETs currently in use.

As apparent from the description above, the invention enables integration of the circuit into a package with an exposed wireframe/leadframe, whilst ensuring that the exposed tab is at source potential. This removes the need for isolation when heatsinking and significantly reduces EMI by providing a significant reduction in drain area that can emit EMI.

Figure 5:
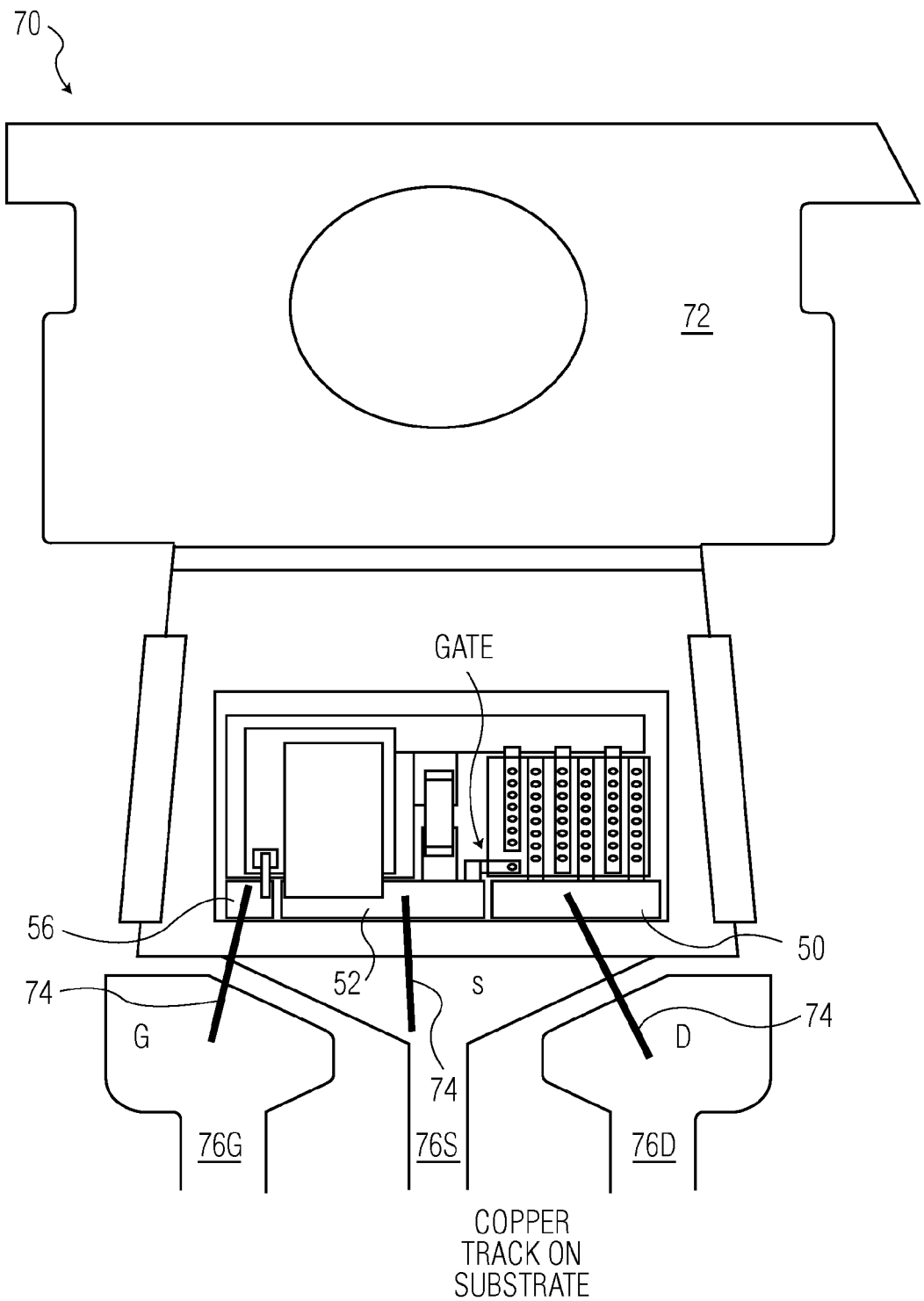
FIG. 5 shows how the circuit of FIG. 4 connects to package terminals of a three pin package.

FIG. 5 shows the integration of the circuit of FIG. 4 into a three-terminal TO220 package 70 with the central tab connected to the die attach pad area and to the heatsink mounting 72.

The connections 74 from the pads 50,52,56 of the circuit substrate to the package terminals 76G, 76S, 76D are ideally of low inductance, such as clip connections, ribbon connections or multiple bondwires.

Figure 6:
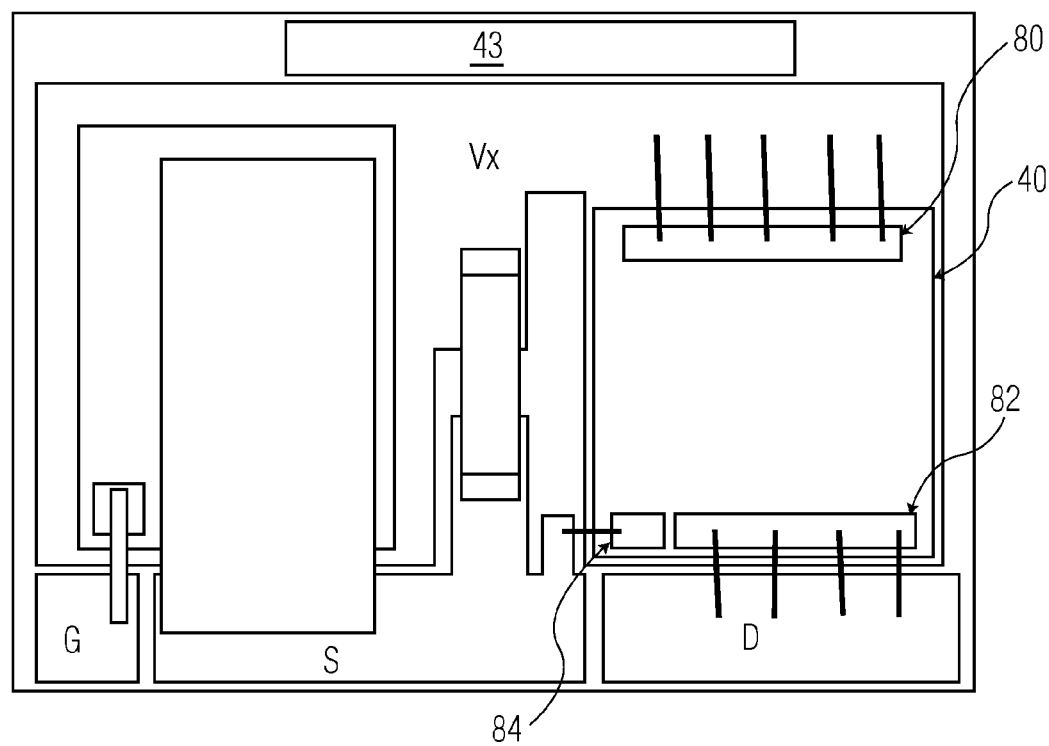
FIG. 6 shows a modification to the circuit of FIG. 4 to provide an alternative mounting of the power transistor.

FIG. 6 shows a modification to FIG. 4 in which the GaN power transistor 40 is wirebonded instead of flip bonded. In this case, the source bond pad 80, drain bond pad 82 and gate pad 84 are at the top of the structure, and bond wires connect to the respective tracks on the substrate. In the example shown, the substrate of the first transistor 40 (which faces downwardly) connects to source potential, i.e. to the intermediate node Vx. However, the substrate could be floating, tied to drain or the source terminal (i.e. the source of the silicon MOSFET).

The invention provides a cascode arrangement which can be optimised for performance by reducing parasitic inductances and by adding extra components.

The invention can be used in all power conversion applications in which normally-off switches are required, and enables the use of normally-on GaN or SiC devices in such applications. By way of example, the invention can be used in:

power factor correction (PFC) circuits, for example as used in grid connected power supplies;

phase legs of high voltage inverter circuits, for example motor drives or photovoltaic converters;

a switched mode (e.g. soft switching) power converter circuits.

Other variations to the disclosed embodiments can be understood and effected by those skilled in the art in practicing the claimed invention, from a study of the drawings, the disclosure, and the appended claims. The mere fact that certain measures are recited in mutually different dependent claims does not indicate that a combination of these measured cannot be used to advantage. Any reference signs in the claims should not be construed as limiting the scope.

The invention claimed is:

1. A cascode transistor circuit comprising:
   a first, depletion mode transistor having its drain for connection to a high power line;
   a second, silicon MOSFET with its drain connected to the source of the first transistor and its source for connection to a low power line;
   a substrate on which the first and second transistors are mounted, which has a conductive track providing the connection between the source of the first transistor and the drain of the second transistor; and
   wherein the first, depletion mode, transistor comprises a high electron mobility transistor or a junction gate field effect transistor.

2. A cascode transistor circuit as claimed in claim 1, formed as a packaged device, with a first connection from the first transistor drain to a first package terminal, a second connection from the second transistor gate to a second package terminal and a third connection from the second transistor source to a third package terminal, wherein one of the package terminals comprises a die attach pad terminal.

3. A circuit as claimed in claim 2, wherein the second transistor source connects to the die attach pad terminal.

4. A circuit as claimed in claim 2, comprising a three terminal package.

5. A circuit as claimed in claim 1, wherein the second transistor is a vertical device.

6. A circuit as claimed in claim 5, wherein the second transistor drain is at the bottom.

7. A circuit as claimed in claim 1, wherein the substrate (43) comprises a ceramic substrate.

8. A circuit as claimed in claim 1,
wherein the first transistor comprises solder bumps and is flip bonded onto the substrate.

9. A circuit as claimed in claim 1, wherein the second transistor comprises connection clips which connect onto the substrate.

10. A circuit as claimed in claim 1, comprising further components mounted on the substrate.

11. A circuit as claimed in claim 10, wherein the further components comprise:
   a capacitor, RC snubber circuit or diode for limiting the maximum voltage at the drain of the first transistor point; or
   a diode for power factor correction.

12. A circuit as claimed in claim 1, wherein the first, depletion mode, transistor comprises a GaN transistor.

13. A circuit arrangement comprising:
   a cascode transistor circuit as claimed in claim 1; and
   a gate driver circuit having a single gate output line.

14. A device comprising a circuit arrangement as claimed in claim 13, wherein the device comprises:
   a power supply; or
   a power factor correction circuit; or
   an inverter circuit; or
   a switched mode power converter circuit.

15. A cascode transistor circuit comprising:
   a first, depletion mode transistor having its drain for connection to a high power line;
   a second, silicon MOSFET with its drain connected to the source of the first transistor and its source for connection to a low power line;
   a substrate on which the first and second transistors are mounted, which has a conductive track providing the connection between the source of the first transistor and the drain of the second transistor; and
   further components mounted on the substrate, wherein the further components include:
   a capacitor, RC snubber circuit or diode for limiting the maximum voltage at the drain of the first transistor point; or
   a diode for power factor correction.

16. A circuit arrangement comprising:
   a cascode transistor circuit including,
      a first, depletion mode transistor having its drain for connection to a high power line;
      a second, silicon MOSFET with its drain connected to the source of the first transistor and its source for connection to a low power line;
      a substrate on which the first and second transistors are mounted, which has a conductive track providing the connection between the source of the first transistor and the drain of the second transistor; and
   a gate driver circuit having a single gate output line.

17. A device comprising a circuit arrangement as claimed in claim 16, wherein the device comprises:
   a power supply; or
   a power factor correction circuit; or
   an inverter circuit; or
   a switched mode power converter circuit.

* * * * *